US012125679B2

(12) United States Patent
Koshimizu et al.

(10) Patent No.: US 12,125,679 B2
(45) Date of Patent: Oct. 22, 2024

(54) PLASMA PROCESSING APPARATUS AND PROCESSING METHOD

(71) Applicant: Tokyo Electron Limited, Tokyo (JP)

(72) Inventors: Chishio Koshimizu, Miyagi (JP); Gen Tamamushi, Miyagi (JP); Masahiro Inoue, Miyagi (JP); Yuto Kosaka, Miyagi (JP); Shoichiro Matsuyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 174 days.

(21) Appl. No.: 17/951,579

(22) Filed: Sep. 23, 2022

(65) Prior Publication Data

US 2023/0094655 A1   Mar. 30, 2023

(30) Foreign Application Priority Data

Sep. 24, 2021   (JP) ................................ 2021-155740

(51) Int. Cl.
*H01J 37/00*   (2006.01)
*H01J 37/32*   (2006.01)

(52) U.S. Cl.
CPC ... *H01J 37/32211* (2013.01); *H01J 37/32165* (2013.01); *H01J 37/32183* (2013.01); *H01J 37/3244* (2013.01)

(58) Field of Classification Search
CPC ........... H01J 37/32174; H01J 37/32211; H01J 37/32165; H01J 37/32183; H01J 37/3244
See application file for complete search history.

(56) References Cited

U.S. PATENT DOCUMENTS

| 10,991,554 | B2* | 4/2021 | Zhao | H01J 37/32128 |
| 11,476,089 | B2* | 10/2022 | Koshimizu | H01J 37/32532 |
| 11,742,183 | B2* | 8/2023 | Hisatomi | H01J 37/32146 |
| | | | | 315/111.21 |
| 2017/0236743 | A1* | 8/2017 | Severson | H01L 21/68742 |
| | | | | 414/806 |
| 2022/0106566 | A1* | 4/2022 | Mayadas | A61P 35/00 |

FOREIGN PATENT DOCUMENTS

| JP | 2003-139804 A | 5/2003 |
| JP | 2009-246091 A | 10/2009 |
| JP | 2017-130528 A | 7/2017 |

* cited by examiner

*Primary Examiner* — Tuan T Lam
(74) *Attorney, Agent, or Firm* — XSENSUS LLP

(57) ABSTRACT

A plasma processing apparatus includes: a chamber; a substrate support provided in the chamber; a bias power supply that supplies an electrical bias energy to an electrode of the substrate support; a matching box including a matching circuit; a radio-frequency power supply that supplies a radio-frequency power having a variable frequency into the chamber through the matching box, and adjusts the frequency of the radio-frequency power in each of a plurality of phase periods within the cycle of the electrical bias energy; a sensor that detects an electrical signal reflecting a deviation of a load impedance of the radio-frequency power supply from a matching state; and a filter that generates a filtered signal by removing and an intermodulation distortion component of the radio-frequency power and the electrical bias energy from the electrical signal in each of the plurality of phase periods.

11 Claims, 7 Drawing Sheets

PLASMA PROCESSING APPARATUS AND PROCESSING METHOD

CROSS-REFERENCE TO RELATED APPLICATIONS

This application is based on and claims priority from Japanese Patent Application No. 2021-155740, filed on Sep. 24, 2021, with the Japan Patent Office, the disclosure of which is incorporated herein in its entirety by reference.

TECHNICAL FIELD

The present disclosure relates to a plasma processing apparatus and a processing method.

BACKGROUND

A plasma processing apparatus is used for a plasma processing performed on a substrate. In the plasma processing apparatus, a radio-frequency bias power is used to draw ions from plasma generated in a chamber into the substrate. Japanese Patent Laid-Open Publication No. 2009-246091 discloses a plasma processing apparatus which modulates the power level and frequency of the radio-frequency bias power.

SUMMARY

An embodiment provides a plasma processing apparatus. The plasma processing apparatus includes: a chamber; a substrate support, a bias power supply, a matcher, a radio-frequency power supply, a sensor, and a filter. The substrate support is provided in the chamber. The bias power supply supplies an electrical bias energy to an electrode of the substrate support, in order to draw ions from a plasma generated in the chamber into the substrate placed on the substrate support. The electrical bias energy has a bias frequency. A cycle of the electrical bias energy has a time length which is a reciprocal of the bias frequency. The matcher includes a matching circuit. The radio-frequency power supply supplies a radio-frequency power having a variable frequency into the chamber through the matcher in order to generate the plasma from a gas in the chamber. The radio-frequency power supply adjusts the variable frequency of the radio-frequency power in each of a plurality of phase periods within the cycle of the electrical bias energy. The sensor detects an electrical signal reflecting a deviation of a load impedance of the radio-frequency power supply from a matching state. The filter generates a filtered signal by removing an intermodulation distortion component of the radio-frequency power and the electrical bias energy from the electrical signal in each of the plurality of phase periods.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
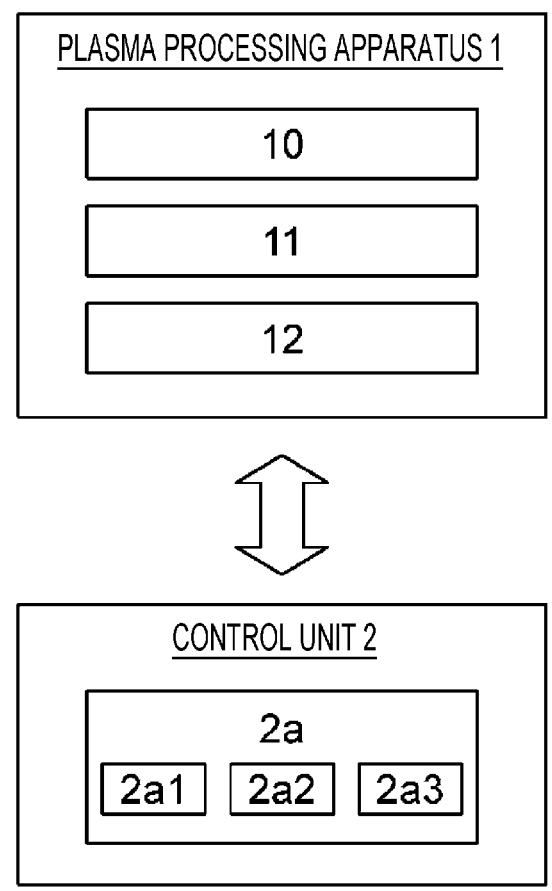
FIG. 1 is a view schematically illustrating a plasma processing apparatus according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various embodiments will be described.

An embodiment provides a plasma processing apparatus. The plasma processing apparatus includes: a chamber; a substrate support, a bias power supply, a matcher, a radio-frequency power supply, a sensor, and a filter. The substrate support is provided in the chamber. The bias power supply supplies an electrical bias energy to an electrode of the substrate support, in order to draw ions from a plasma generated in the chamber into the substrate placed on the substrate support. The electrical bias energy has a bias frequency. A cycle of the electrical bias energy has a time length which is a reciprocal of the bias frequency. The matcher includes a matching circuit. The radio-frequency power supply supplies a radio-frequency power having a variable frequency into the chamber through the matcher in order to generate the plasma from a gas in the chamber. The radio-frequency power supply adjusts the variable frequency of the radio-frequency power in each of a plurality of phase periods within the cycle of the electrical bias energy. The sensor detects an electrical signal reflecting a deviation of a load impedance of the radio-frequency power supply from a matching state. The filter generates a filtered signal by removing an intermodulation distortion component of the radio-frequency power and the electrical bias energy from the electrical signal in each of the plurality of phase periods.

In the embodiment above, the variable frequency of the radio-frequency power is adjusted in the plurality of phase periods within the cycle of the electrical bias energy. In each of the plurality of phase periods, the intermodulation distortion component is removed according to the frequency of the radio-frequency power from the electrical signal reflecting the deviation of the load impedance of the radio-frequency power supply from the matching state. Thus, in the plasma processing apparatus using the radio-frequency power supply that generates the radio-frequency power having the variable frequency for generating plasma, an unnecessary component may be removed from the electrical signal reflecting the matching state of the load impedance of the radio-frequency power supply.

In the embodiment, the radio-frequency power supply may adjust the variable frequency of the radio-frequency power based on the filtered signal to make the load impedance of the radio-frequency power supply close to a matching state, in each of the plurality of phase periods.

In the embodiment, the electrical signal detected by the sensor may include a signal representing a power of a reflected wave from a load of the radio-frequency power.

In the embodiment, the electrical signal detected by the sensor may include signals representing a voltage and a current which are measured on a transmission path of the radio-frequency power.

In the embodiment, the radio-frequency power supply may include an oscillator and an amplifier. The oscillator generates a radio-frequency signal. The amplifier amplifies the radio-frequency signal, thereby generating the radio-frequency power. The plasma processing apparatus may include a mixer. The mixer mixes the radio-frequency signal and the electrical signal with each other to generate a mixed signal. The filter generates the filtered signal from the mixed signal, and has a passband of which center frequency is 0 and width is smaller than the bias frequency.

In the embodiment, the filter may include a plurality of filters having different passbands. Among the plurality of filters, a filter with a passband including the frequency of the radio-frequency power in each of the plurality of phase periods may be applied to the electrical signal.

In the embodiment, the electrical bias energy may be a bias radio-frequency power having the bias frequency. Alternatively, the electrical bias energy may include a voltage pulse generated periodically at a time interval having a time length which is a reciprocal of the bias frequency, or a voltage of any waveform that is periodically generated.

In the embodiment, the plasma processing apparatus may further include an upper electrode provided above the substrate support. The radio-frequency power supply may be electrically connected to the electrode of the substrate support or to the upper electrode through the matcher.

In the embodiment, the plasma processing apparatus may further include a voltage sensor that detects a voltage of the electrical bias energy on a transmission path of the electrical bias energy. The radio-frequency power supply may specify the cycle of the electrical bias energy and the plurality of phase periods based on the voltage detected by the voltage sensor.

Another embodiment provides a processing method. The processing method includes: (a) supplying a radio-frequency power from a radio-frequency power supply into a chamber of a plasma processing apparatus through a matcher in order to generate a plasma from a gas in the chamber of the plasma processing apparatus. The plasma processing apparatus includes a substrate support provided in the chamber. The processing method further includes: (b) supplying an electrical bias energy to an electrode of the substrate support, in order to draw ions from the plasma into a substrate placed on the substrate support. The processing method further includes (c) detecting an electrical signal reflecting a deviation of a load impedance of the radio-frequency power supply from a matching state. The processing method further includes (d) generating a filtered signal from the electrical signal by using a filter. The electrical bias energy has a bias frequency, and a cycle of the electrical bias energy has a time length which is a reciprocal of the bias frequency. A frequency of the radio-frequency power is variable. In (a), the frequency of the radio-frequency power in each of a plurality of phase periods within the cycle of the electrical bias energy is adjusted. In (d), the filtered signal is generated by removing an intermodulation distortion component of the radio-frequency power and the electrical bias energy from the electrical signal in each of the plurality of phase periods.

Hereinafter, various embodiments will be described in detail with reference to the drawings. In the respective drawings, similar or corresponding portions will be denoted by the same reference numerals.

Figure 2:
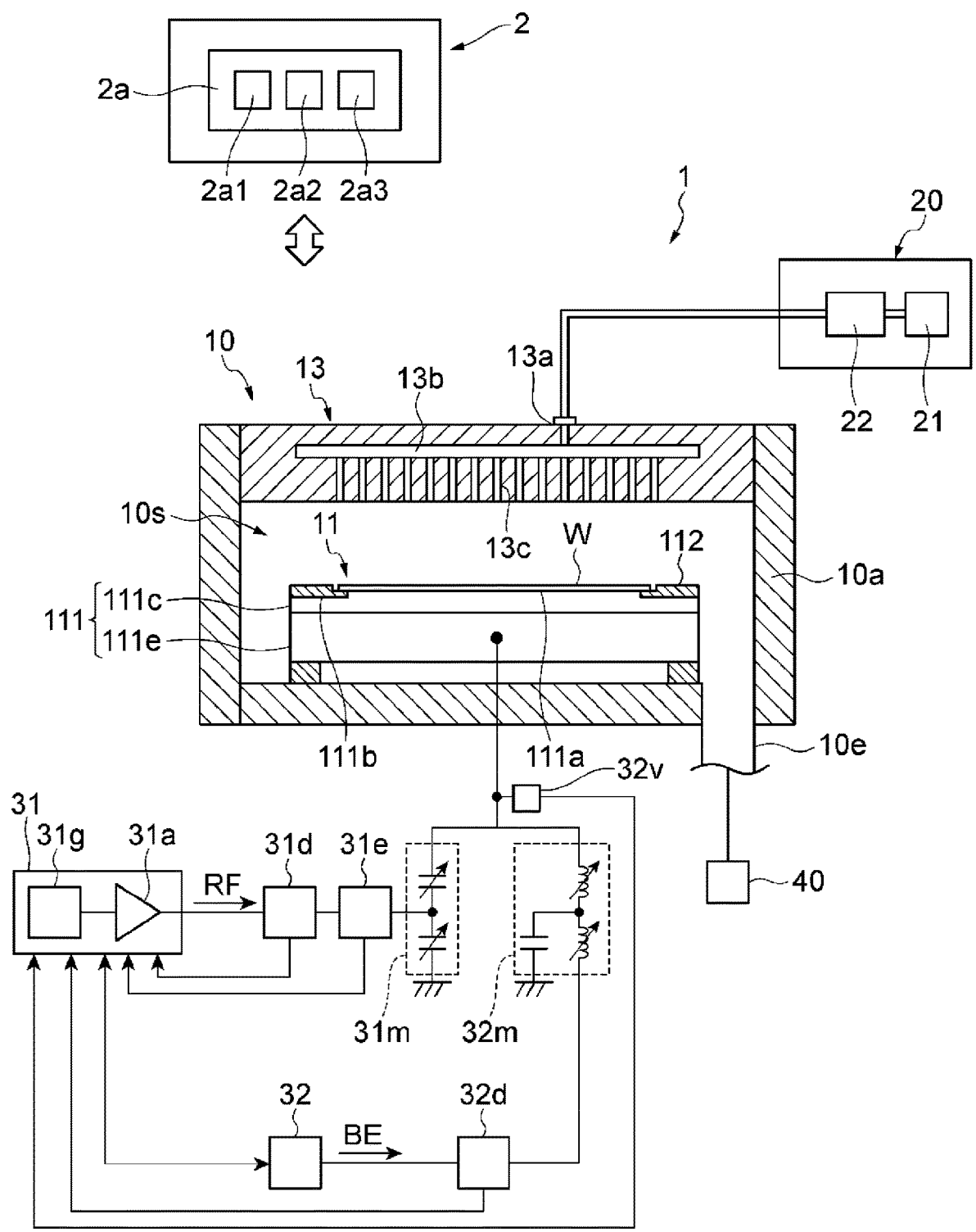
FIG. 2 is a view schematically illustrating a plasma processing apparatus according to an embodiment.

FIGS. 1 and 2 are views schematically illustrating a plasma processing apparatus according to an embodiment.

In an embodiment, a plasma processing system includes a plasma processing apparatus 1 and a control unit 2. The plasma processing apparatus 1 includes a plasma processing chamber 10, a substrate support 11, and a plasma generation unit 12. The plasma processing chamber 10 has a plasma processing space. Further, the plasma processing chamber 10 includes at least one gas supply port for supplying at least one processing gas to the plasma processing space, and at least one gas discharge port for discharging a gas from the plasma processing space. The gas supply port is connected to a gas supply unit 20 to be described later, and the gas discharge port is connected to an exhaust system 40 to be described later. The substrate support 11 is disposed in the plasma processing space, and has a substrate support surface for supporting a substrate.

The plasma generation unit 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance (ECR) plasma, helicon wave excited plasma (HWP), or surface wave plasma (SWP).

The control unit 2 processes computer-executable commands for causing the plasma processing apparatus 1 to execute various steps described therein. The control unit 2 may be configured to control each part of the plasma processing apparatus 1 to perform the various steps described herein. In an embodiment, a portion of the control unit 2 or the entire control unit 2 may be included in the plasma processing apparatus 1. The control unit 2 may include, for example, a computer 2a. The computer 2a may include, for example, a processing unit (central processing unit; CPU) 2a1, a storage unit 2a2, and a communication interface 2a3. The processing unit 2a1 may be configured to perform various control operations based on programs stored in the storage unit 2a2. The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Hereinafter, an example of a configuration of a capacitively coupled plasma processing apparatus which is an example of the plasma processing apparatus 1 will be described. The capacitively coupled plasma processing apparatus 1 includes the plasma processing chamber 10, the gas supply unit 20, and the exhaust system 40. Further, the plasma processing apparatus 1 includes the substrate support 11 and a gas introduction unit. The gas introduction unit is configured to introduce at least one processing gas into the plasma processing chamber 10. The gas introduction unit includes a shower head 13. The substrate support 11 is disposed inside the plasma processing chamber 10. The shower head 13 is disposed above the substrate support 11. In an embodiment, the shower head 13 makes up at least a portion of the ceiling of the plasma processing chamber 10. The plasma processing chamber 10 has the plasma processing space 10s defined by the shower head 13, the side wall 10a of the plasma processing chamber 10, and the substrate support 11. The side wall 10a is grounded. The shower head 13 and the substrate support 11 are electrically insulated from the housing of the plasma processing chamber 10.

The substrate support 11 includes a main body 111 and a ring assembly 112. The main body 111 has a central region (substrate support surface) 111a for supporting a substrate (wafer) W, and an annular region (ring support surface) 111b for supporting the ring assembly 112. The annular region 111b of the main body 111 surrounds the central region 111a of the main body 111 in a plan view. The substrate W is placed on the central region 111a of the main body 111, and the ring assembly 112 is disposed on the annular region 111b of the main body 111 to surround the substrate W placed on the central region 111a of the main body 111. In an embodiment, the main body 111 includes a base 111e and an electrostatic chuck 111c. The base 111e includes a conductive member. The conductive member of the base 111e functions as a lower electrode. The electrostatic chuck 111c is disposed on the base 111e. The upper surface of the electrostatic chuck 111c has the substrate support surface 111a. The ring assembly 112 includes one or more annular members. At least one of the one or more annular members is an edge ring. Although not illustrated, the substrate support 11 may include a temperature adjustment module configured to adjust at least one of the electrostatic chuck 111c, the ring assembly 112, and the substrate W to a target temperature. The temperature adjustment module may include a heater, a heat transfer medium, a flow path, or a combination thereof. A heat transfer fluid such as brine or a gas flows through the flow path. The substrate support 11 may include a heat transfer gas supply unit configured to supply a heat transfer gas to the space between the rear surface of the substrate W and the substrate support surface 111a.

The shower head 13 is configured to introduce at least one processing gas from the gas supply unit 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes a conductive member. The conductive member of the shower head 13 functions as an upper electrode. The gas introduction unit may include one or a plurality of side gas injectors (SGI) attached to one or a plurality of openings formed in the side wall 10a, in addition to the shower head 13.

The gas supply unit 20 may include one or more gas sources 21 and one or more flow rate controllers 22. In an embodiment, the gas supply unit 20 is configured to supply one or more processing gases from their corresponding gas sources 21 to the shower head 13 via their corresponding flow rate controllers 22. Each flow rate controller 22 may include, for example, a mass flow controller or a pressure-controlled flow rate controller. The gas supply unit 20 may further include one or more flow rate modulation devices that modulate or pulse the flow rates of one or more processing gases.

The exhaust system 40 may be connected to a gas outlet 10e provided at, for example, the bottom of the plasma processing chamber 10. The exhaust system 40 may include a pressure regulating valve and a vacuum pump. The pressure in the plasma processing space 10s is adjusted by the pressure adjusting valve. The vacuum pump may include a turbo molecular pump, a dry pump, or a combination thereof.

Figure 3:
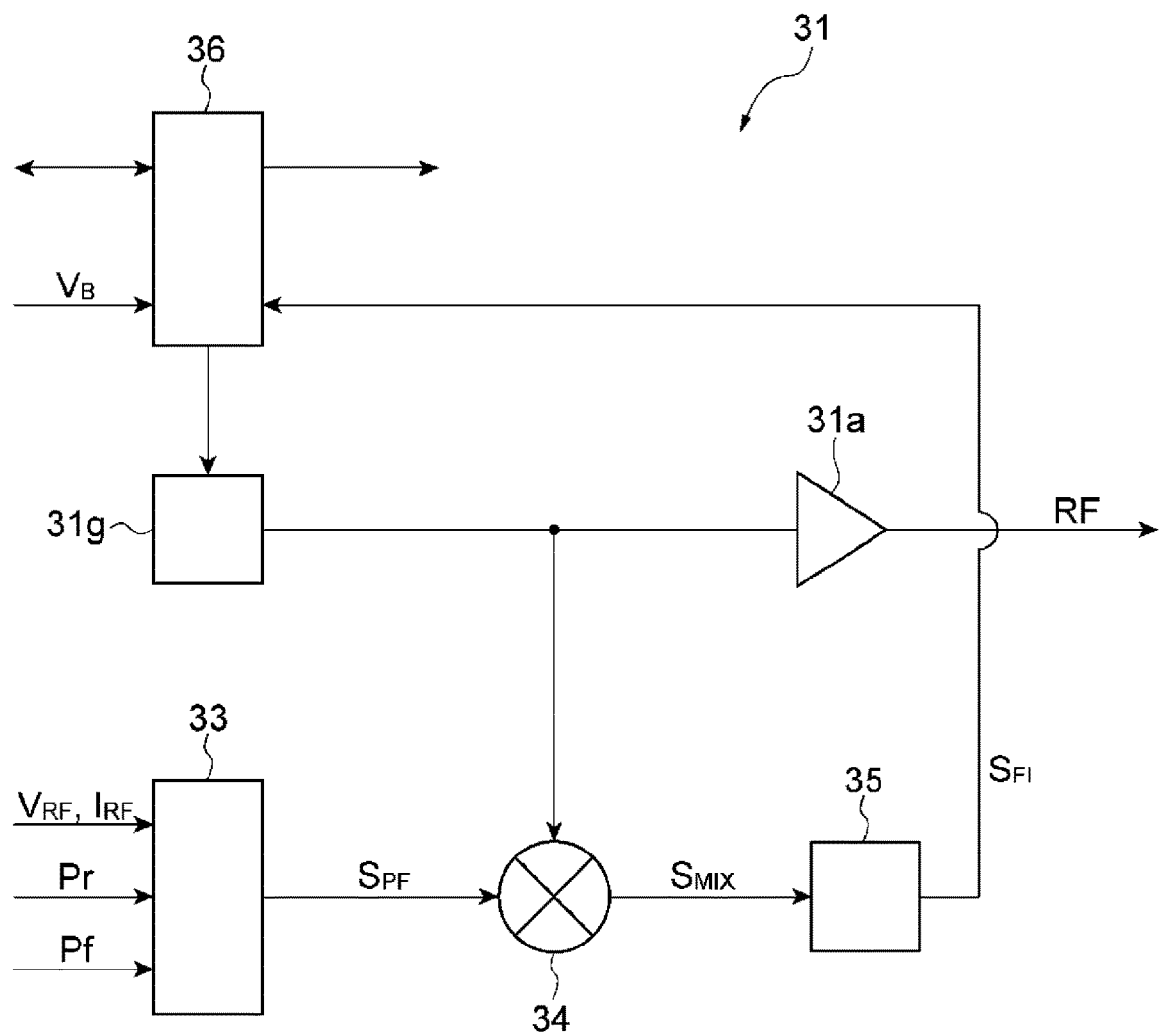
FIG. 3 is a view illustrating an example of a configuration of a radio-frequency power supply in a plasma processing apparatus according to an embodiment.
Figure 4:
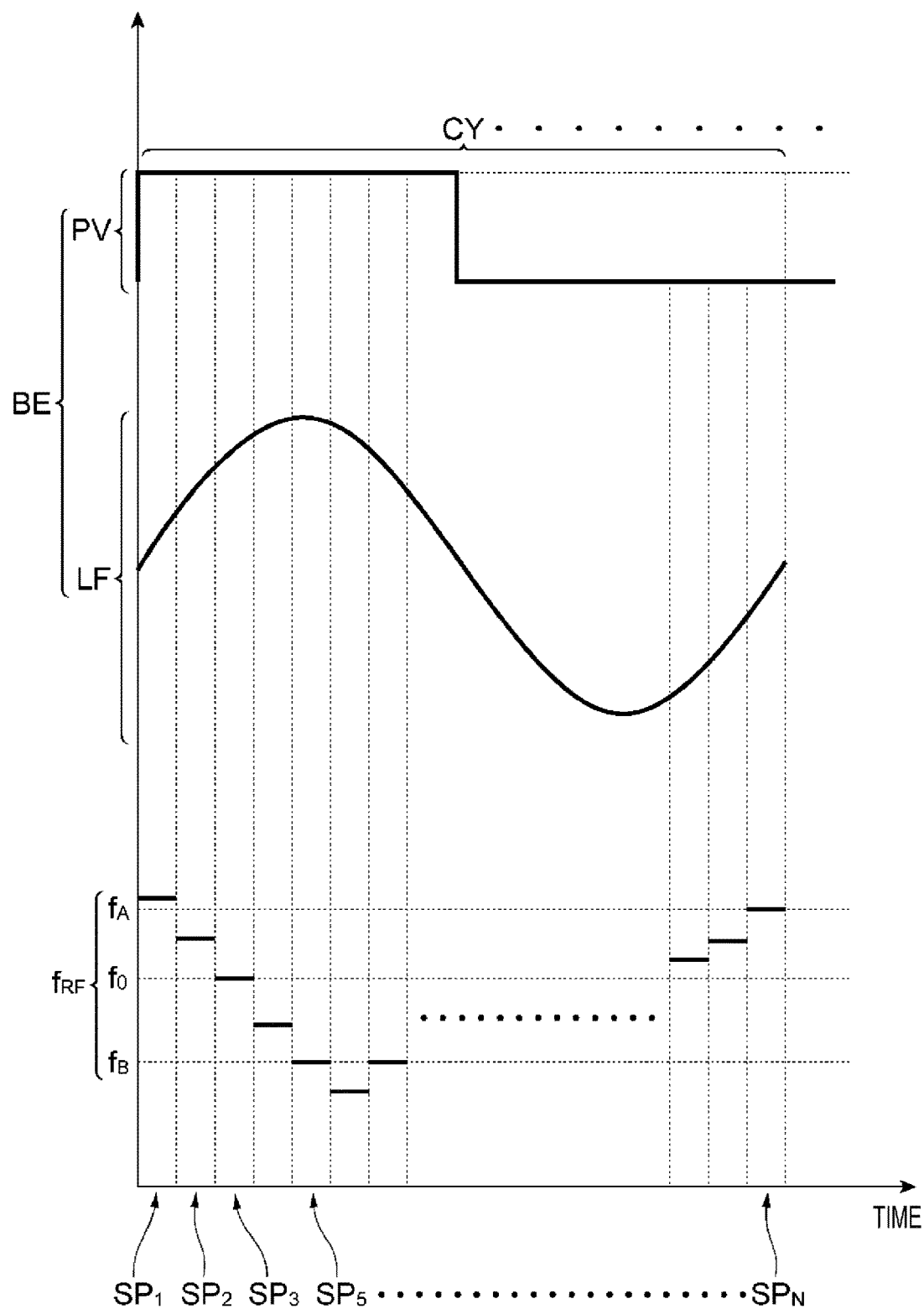
FIG. 4 is a timing chart illustrating an example of frequencies of an electrical bias energy and a radio-frequency power.

The plasma processing apparatus 1 further includes a radio-frequency power supply 31 and a bias power supply 32. Hereinafter, FIGS. 3 and 4 will be referred to, along with FIG. 2. FIG. 3 is a view illustrating an example of a configuration of a radio-frequency power supply in a plasma processing apparatus according to an embodiment. FIG. 4 is a timing chart illustrating an example of frequencies of an electrical bias energy and a radio-frequency power.

The radio-frequency power supply 31 is configured to supply a radio-frequency power RF (i.e., source radio-frequency power) to a radio-frequency electrode via a matcher 31m, in order to generate plasma from a gas in the chamber 10. The frequency of the radio-frequency power RF, i.e., a source frequency $f_{RF}$ is variable. The radio-frequency power RF has, for example, the source frequency $f_{RF}$ of 13 MHz or more and 150 MHz or less.

The radio-frequency power supply 31 is electrically connected to the radio-frequency electrode via the matcher 31m. In an embodiment, the radio-frequency electrode may be the electrode of the substrate support 11. The radio-frequency electrode may be the base 111e. The matcher 31m includes a matching circuit. The matching circuit of the matcher 31m has a variable impedance. The matching circuit of the matcher 31m is controlled by the control unit 2, or a control unit 36 to be described later. The impedance of the matching circuit of the matcher 31m is adjusted such that a load-side impedance of the radio-frequency power supply 31 matches with an output impedance of the radio-frequency power supply 31. The radio-frequency electrode may be an electrode provided inside the substrate support 11 separate from the base 111e. Alternatively, the radio-frequency electrode may be the upper electrode.

The bias power supply 32 is configured to supply an electrical bias energy BE to a bias electrode of the substrate support 11, in order to draw ions from plasma generated in the chamber 10 into the substrate W placed on the substrate support 11. The bias electrode may be the base 111e. The bias electrode may be an electrode provided inside the substrate support 11 separate from the base 111e. The electrical bias energy BE has a bias frequency $f_B$. A cycle CY of the electrical bias energy (i.e., a bias cycle) has a time length which is a reciprocal of the bias frequency $f_B$. The bias frequency $f_B$ is, for example, a frequency of 100 kHz or more and 13.56 MHz or less.

In an embodiment, the electrical bias energy BE may be a radio-frequency power having the bias frequency $f_B$, i.e., a bias radio-frequency power LF. The bias radio-frequency power LF has a sinusoidal waveform in the cycle CY. When the electric bias energy BE is the bias radio-frequency power LF, the bias power supply 32 is connected to the bias electrode through a matcher 32m. The matcher 32m includes a matching circuit. The matching circuit of the matcher 32m has a variable impedance. The matching circuit of the matcher 32m is controlled by the control unit 2 or the control unit 36. The impedance of the matching circuit of the matcher 32m is adjusted such that a load-side impedance of the bias power supply 32 matches with an output impedance of the bias power supply 32.

In another embodiment, the electrical bias energy BE may be a voltage pulse PV or a voltage of any waveform which is generated periodically at a time interval having a time length which is a reciprocal of the bias frequency $f_B$ (i.e., the cycle CY). The voltage pulse PV used as the electrical bias energy BE may be a negative voltage pulse or a negative DC voltage pulse. The voltage pulse PV may have any waveform such as a triangular wave or a square wave. When the voltage pulse PV is used as the electrical bias energy BE, a filter may be connected between the bias power supply 32 and the bias electrode to block the radio-frequency power RF, instead of the matcher 32m.

In an embodiment, the radio-frequency power supply 31 may include an oscillator 31g, an amplifier 31a, a filter 33, a mixer 34, a filter 35, and the control unit 36. The filter 33, the mixer 34, the filter 35, and the control unit 36 may be components separated from the radio-frequency power supply 31.

The oscillator 31g is configured to generate a radio-frequency signal. The radio-frequency signal has the source frequency $f_{RF}$ designated by the control unit 36. The amplifier 31a amplifies the radio-frequency signal generated by the oscillator 31g to generate the radio-frequency power RF. The amplification factor of the amplifier 31 is controlled by the control unit 36.

The control unit 36 is configured with a processor. The control unit 36 is communicably connected to the control unit 2. The source frequency $f_{RF}$ and the amplification factor of the amplifier 31a may be initially designated from the control unit 2 to the control unit 36 according to recipe data stored in the storage unit 2a2. The control unit 36 may send a synchronization signal to the bias power supply 32 for a synchronization between the radio-frequency power supply 31 and the bias power supply 32.

In the plasma processing apparatus 1, as illustrated in FIG. 4, the cycle CY of the electrical bias energy BE is divided into a plurality of phase periods SP, i.e., an N number of phase periods $SP_1$ to $SP_N$. The time length of each of the phase periods $SP_1$ to $SP_N$ is predetermined. The time lengths of the phase periods $SP_1$ to $SP_N$ may be the same or different from each other.

In the plasma processing apparatus 1, the source frequency $f_{RF}$ is adjusted in each of the plurality of phase periods SP within the period CY, during a period when the radio-frequency power RF is supplied so that the electrical bias energy BE is supplied. That is, a source frequency $f_{RFn}$ in an n-th phase period $SP_n$ within the cycle CY is adjusted. Here, "n" is an integer of 1 to N. The source frequency $f_{RF}$ in each of the plurality of phase periods SP, i.e., the source frequency $f_{RFn}$ is designated by the control unit 36. In the example illustrated in FIG. 4, source frequencies $f_{RF3}$, $f_{RF5}$, and $f_{RFN}$ of the phase periods $SP_3$, $SP_5$, and $SP_N$ are $f_0$, $f_B$, and $f_A$, respectively. The oscillator 31g generates a radio-frequency signal having the source frequency $f_{RF}$ designated by the control unit 36 in each of the plurality of phase periods SP.

In the radio-frequency power supply 31, the cycle CY and the plurality of phase periods SP may be specified by the control unit 36. In an embodiment, the control unit 36 may specify the cycle CY from a power of a traveling wave of the electrical bias energy BE acquired in a directional coupler 32d, and may specify the plurality of phase periods SP by dividing the cycle CY. The directional coupler 32d may be connected between the bias power supply 32 and the matcher 32m.

Alternatively, the control unit 36 may specify the cycle CY based on a voltage detected by a voltage sensor 32v, and may specify the plurality of phase periods SP by dividing the cycle CY. The voltage sensor 32v is configured to detect the voltage of the electrical bias energy BE on a transmission path of the electrical bias energy BE. The voltage sensor 32v may detect the voltage of the electrical bias energy BE on a transmission path between the matcher 32m and the bias electrode.

In the plasma processing apparatus 1, one or more electric signals are acquired by the sensor on the transmission path of the radio-frequency power RF in each of the plurality of phase periods SP. Then, the impedance matching is performed based on the one or more acquired electrical signals, in each of the plurality of phase periods SP. The one or more electrical signals reflect a deviation of the load impedance of the radio-frequency power supply 31 from a matching state.

The one or more electrical signals may include a signal representing a power Pr of a reflected wave from the load of the radio-frequency power. The one or more electrical signals may further include a signal representing a power Pf of a traveling wave from the load of the radio-frequency power. The directional coupler 31d acquires the signal representing the power Pr of the reflected wave and the signal representing the power Pf of the traveling wave. The directional coupler 31d is connected between the radio-frequency power supply 31 and the matcher 31m. The directional coupler 31d may be a portion of the amplifier 31a. Alternatively, the directional coupler 31d may be a portion of the matcher 31m.

The one or more electrical signals may include a signal representing a voltage $V_{RF}$ of the radio-frequency power RF and a signal representing a current $I_{RF}$ which are measured on the transmission path of the radio-frequency power RF. A sensor 31e measures the signal representing the voltage $V_{RF}$ and the signal representing the current $I_{RF}$. The sensor 31e may be a portion of the matcher 31m.

Figure 5:
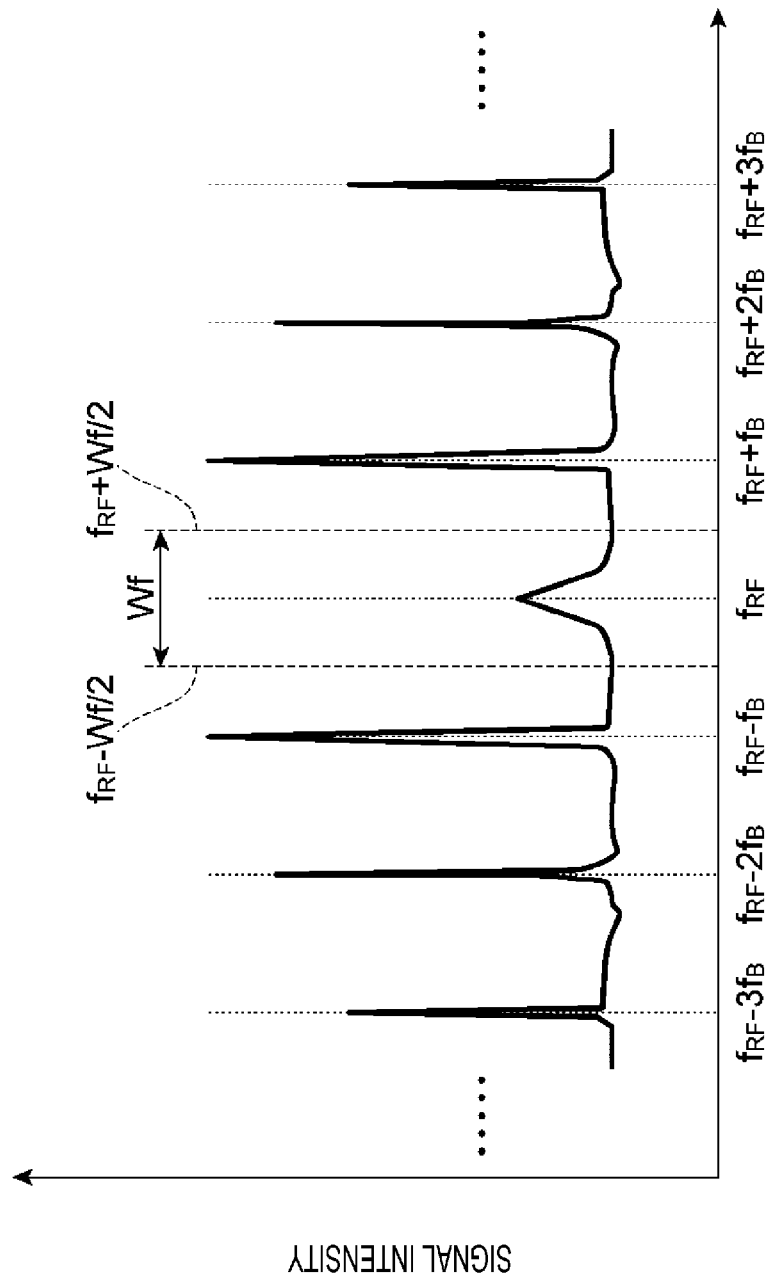
FIG. 5 is a view illustrating an example of a frequency spectrum of an electrical signal.

Each of the one or more electrical signals includes a harmonic component. The frequency of the harmonic component is $f_{RF} \pm k \times f_{RF}$. The "k" is a natural number and is 1, 2, 3, . . . . Each of the one or more electrical signals also includes an intermodulation distortion component between the radio-frequency power RF and the electrical bias energy BE. FIG. 5 is a view illustrating an example of a frequency spectrum of each electrical signal. As illustrated in FIG. 5, the frequency of the intermodulation distortion component is $f_{RF} \pm m \times f_B$. The "m" is a natural number and is 1, 2, 3, . . . .

In the plasma processing apparatus 1, one or more signals $S_{FI}$ are generated from the one or more electrical signals acquired in each of the plurality of phase periods SP. To this end, the filter 33, the mixer 34, and the filter 35 are used.

The filter 33 removes the harmonic component from each of the one or more electrical signals. By the filter 33, one or more signals $S_{PF}$ are generated from the one or more electrical signals. Each of the one or more signals $S_{PF}$ is input to the mixer 34. Each of the one or more electrical signals may be input to the mixer 34. In this case, the plasma processing apparatus 1 may not include the filter 33.

The mixer 34 mixes each of the one or more signals $S_{PF}$ or each of the one or more electrical signals with the radio-frequency signal generated by the oscillator 31g. By the mixer 34, one or more mixed signals $S_{MIX}$ are generated from the one or more signals $S_{PF}$ or the one or more electrical signals. Each of the one or more mixed signals $S_{MIX}$ is an intermediate frequency signal obtained by shifting the frequency of the corresponding signal $S_{PF}$ or the corresponding electrical signal by $f_{RF}$ in a negative direction. The intermediate frequency corresponding to the source frequency $f_{RF}$ in the mixed signals $S_{MIX}$ is 0.

The filter 35 removes the intermodulation distortion component from each of the one or more mixed signals $S_{MIX}$. In each mixed signal $S_{MIX}$, the frequency of the intermodulation distortion component is $0 \pm m \times f_B$. The "m" is a natural number and is 1, 2, 3, 4, 5, . . . . By the filter 35, one or more filtered signals, i.e., the one or more signals $S_{FI}$ are generated from the one or more mixed signals $S_{MIX}$. The center frequency of the passband of the filter 35 is 0. The passband of the filter 35 is a band between a center frequency −Wf/2 and a center frequency+Wf/2. Wf is the width of the passband of the filter 35. Wf/2 is smaller than $f_B$. Wf may be smaller than $f_B$.

In the plasma processing apparatus 1, the impedance matching is performed based on one or more signals $S_{FIn}$ acquired in each of the plurality of phase periods SP, i.e., the phase period $SP_n$. Here, $S_{FIn}$ represents the one or more signals $S_{FI}$ in the phase period $SP_n$, and "n" is an integer of 1 to N. The impedance matching may be performed in real time based on the one or more signals $S_{FIn}$, in the phase period $SP_n$ of each cycle. Alternatively, the impedance matching based on the one or more signals $S_{FIn}$ acquired within a specific cycle CY may be performed in the phase period $SP_n$ of a subsequent cycle CY. In the impedance matching, the control unit 36 controls each part of the plasma processing apparatus 1.

In an embodiment, the radio-frequency power supply adjusts the source frequency $f_{RFn}$ based on the one or more signals $S_{FIn}$ to make the load impedance of the radio-frequency power supply 31 close to the matching state. The control unit 36 designates the source frequency $f_{RFn}$ to the oscillator 31g.

In an embodiment, the signal representing the power Pr of the reflected wave is used as an electrical signal in the phase period $SP_n$. In this embodiment, the signal $S_{FIn}$ is acquired from the signal representing the power Pr of the reflected wave in the phase period $S_{Pn}$. Then, the control unit 36 obtains the power Pr of the reflected wave in the phase period $SP_n$ from the signal $S_{FIn}$. For example, an integrated value of a signal intensity of the signal $S_{FIn}$ in the passband of the filter 35 is obtained as the power Pr of the reflected wave in the phase period $SP_n$. Then, the control unit 36 designates the source frequency $f_{RFn}$ set to reduce the obtained power Pr of the reflected wave to the oscillator 31g.

In another embodiment, the signal representing the power Pr of the reflected wave and the signal representing the power Pf of the traveling wave are used as electrical signals in the phase period $SP_n$. In this embodiment, two signals $S_{FIn}$ are acquired from the signal representing the power Pr of the reflected wave and the signal representing the power Pf of the traveling wave in the phase period $SP_n$. A first signal $S1_{FIn}$ of the two signals $S_{FIn}$ is generated from the electrical signal representing the power Pr of the reflected wave, and a second signal $S2_{FIn}$ of the two signals $S_{FIn}$ is generated from the electrical signal representing the power Pf of the traveling wave. Then, the control unit 36 obtains the power Pr of the reflected wave and the power Pf of the traveling wave in the phase period $SP_n$ from the two signals $S_{FIn}$. For example, an integrated value of a signal intensity of the first signal $S1_{FIn}$ in the passband of the filter 35 is obtained as the power Pr of the reflected wave in the phase period $SP_n$. Further, an integrated value of a signal intensity of the second signal $S2_{FIn}$ in the passband of the filter 35 is obtained as the power Pf of the traveling wave in the phase period $SP_n$. Then, the control unit 36 designates the source frequency $f_{RFn}$ set to reduce the value of the ratio of the power Pr of the reflected wave to the power of Pf of the traveling wave, to the oscillator 31g.

In yet another embodiment, a signal representing the voltage $V_{RF}$ and a signal representing the current $I_{RF}$ are used as electrical signals in the phase period $SP_n$. In this embodiment, two signals $S_{FIn}$ are acquired from the signal representing the voltage $V_{RF}$ and the signal representing the current $I_{RF}$ in the phase period $SP_n$. A first signal $S1_{FIn}$ of the two signals $S_{FIn}$ is generated from the electrical signal representing the voltage $V_{RF}$, and a second signal $S2_{FIn}$ of the two signals $S_{FIn}$ is generated from the electrical signal representing the current $I_{RF}$. Then, the control unit 36 obtains the voltage $V_{RF}$ and the current $I_{RF}$ in the phase period $SP_n$ from the two signals $S_{FIn}$, respectively. For example, an integrated value of a signal intensity of the first signal $S1_{FIn}$ in the passband of the filter 35 is obtained as the voltage $V_{RF}$ in the phase period $SP_n$. Further, an integrated value of a signal intensity of the second signal $S2_{FIn}$ in the passband of the filter 35 is obtained as the current $I_{RF}$ in the phase period $SP_n$. Then, from the obtained voltage $V_{RF}$ and current $I_{RF}$, the control unit 36 obtains the load impedance of the radio-frequency power supply 31 in the phase period $SP_n$. Then, the control unit 36 designates the source frequency $f_{RFn}$ set to make the obtained load impedance of the radio-frequency power supply 31 close to the matching point, to the oscillator 31g.

In each embodiment, the impedance of the matching circuit of the matcher 31m may be adjusted such that the load impedance of the radio-frequency power supply 31 become close to the matching state.

In the plasma processing apparatus 1, the source frequency $f_{RF}$ is adjusted in each of the plurality of phase periods SP within the cycle CY of the electrical bias energy BE. In each of the plurality of phase periods, the intermodulation distortion component is removed according to the source frequency $f_{RF}$, from the electrical signal reflecting the deviation of the load impedance of the radio-frequency power supply 31 from the matching state. Thus, in the plasma processing apparatus 1 using the radio-frequency power supply 31 that generates the radio-frequency power RF having a variable frequency for generating plasma, an unnecessary component may be removed from the electrical signal reflecting the matching state of the load impedance of the radio-frequency power supply 31. Further, in the plasma processing apparatus 1, the impedance matching is performed based on a signal obtained by removing the unnecessary component from the electrical signal. Thus, it is possible to effectively suppress the power of the reflected wave from the radio-frequency power RF in each of the plurality of phase periods.

Figure 6:
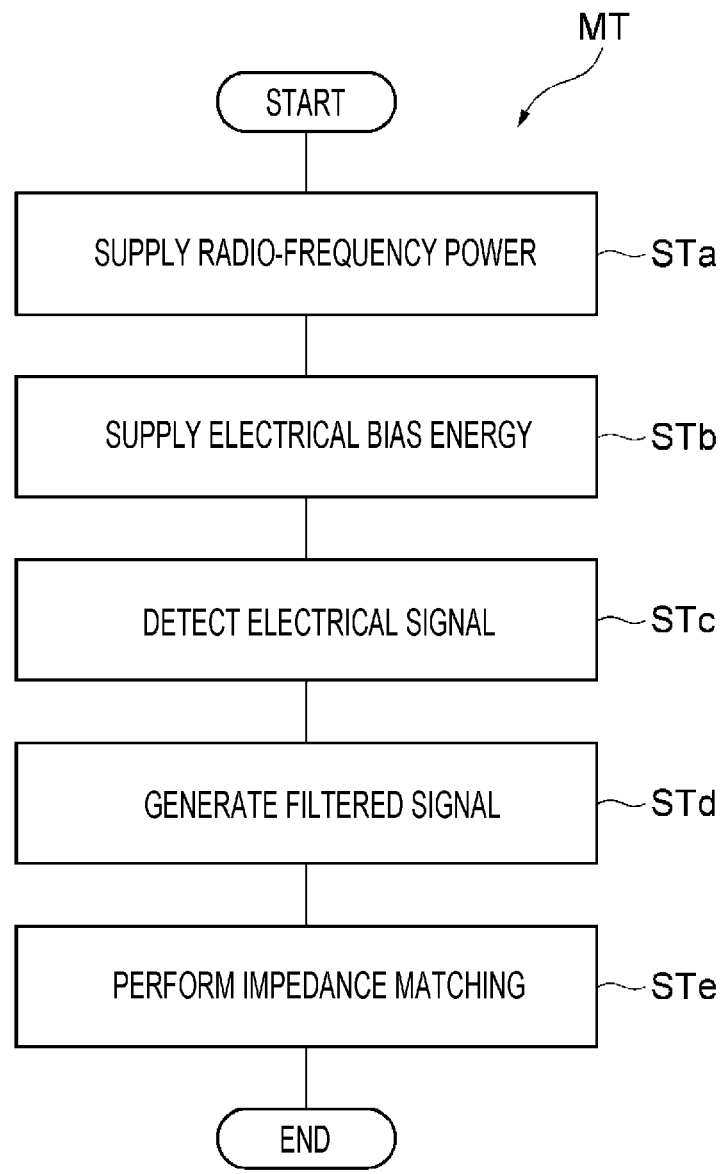
FIG. 6 is a flowchart of a processing method according to an embodiment.

Hereinafter, a processing method according to an embodiment will be described with reference to FIG. 6. FIG. 6 is a flowchart of a processing method according to an embodiment. The processing method illustrated in FIG. 6 (hereinafter, referred to as a "method MT") may be applied to the plasma processing apparatus 1. In order to perform the method MT, the control unit 2 controls each part of the plasma processing apparatus 1. The method MT is performed in a state where the substrate W to be processed is placed on the substrate support 11.

The method MT includes step STa. In step STa, the radio-frequency power is supplied from the radio-frequency power supply 31 through the matcher 31m in order to generate plasma from a gas in the chamber 10. During the period of step STa, the gas supply unit 20 is controlled to supply a gas into the chamber 10. During the period of step STa, the exhaust system 40 is controlled to set the pressure inside the chamber 10 to a designated pressure. Further, in step STa, the radio-frequency power supply 31 is controlled to supply the radio-frequency power RF.

The method MT further includes step STb. In step STb, the electrical bias energy BE is supplied to the bias electrode of the substrate support 11, in order to draw ions from the plasma into the substrate W placed on the substrate support 11. In step STb, the bias power supply 32 is controlled to supply the electrical bias energy BE.

The method MT further includes step STc. In step STc, the one or more electrical signals reflecting the deviation of the load impedance of the radio-frequency power supply 31 from the matching state are detected using a sensor (e.g., the directional coupler 31d and/or the sensor 31e). As for the one or more electrical signals, refer to the descriptions of the plasma processing apparatus 1 above.

The method MT further includes step STd. In step Std, the signals filtered from the one or more electrical signals in each of the plurality of phase periods SP, i.e., the phase period $SP_n$, that is, the one or more signals $S_{FIn}$ are generated. In order to generate the one or more signals $S_{FIn}$, the filter 35 is used as described above.

In step STa, the frequency of the radio-frequency power RF in the phase period $SP_n$, i.e., the source frequency $f_{RFn}$ is adjusted. In step STd, as described above, the one or more signals $S_{FIn}$ are generated by removing the intermodulation distortion component of the radio-frequency power RF and the electrical bias energy BE from the one or more electrical signals in the phase period $SP_n$.

The method MT further includes step STe. In step STe, the impedance matching in the phase period $SP_n$ is performed based on the one or more signals $S_{FIn}$. As for the details of the impedance matching, refer to the descriptions of the plasma processing apparatus 1 above.

Figure 7:
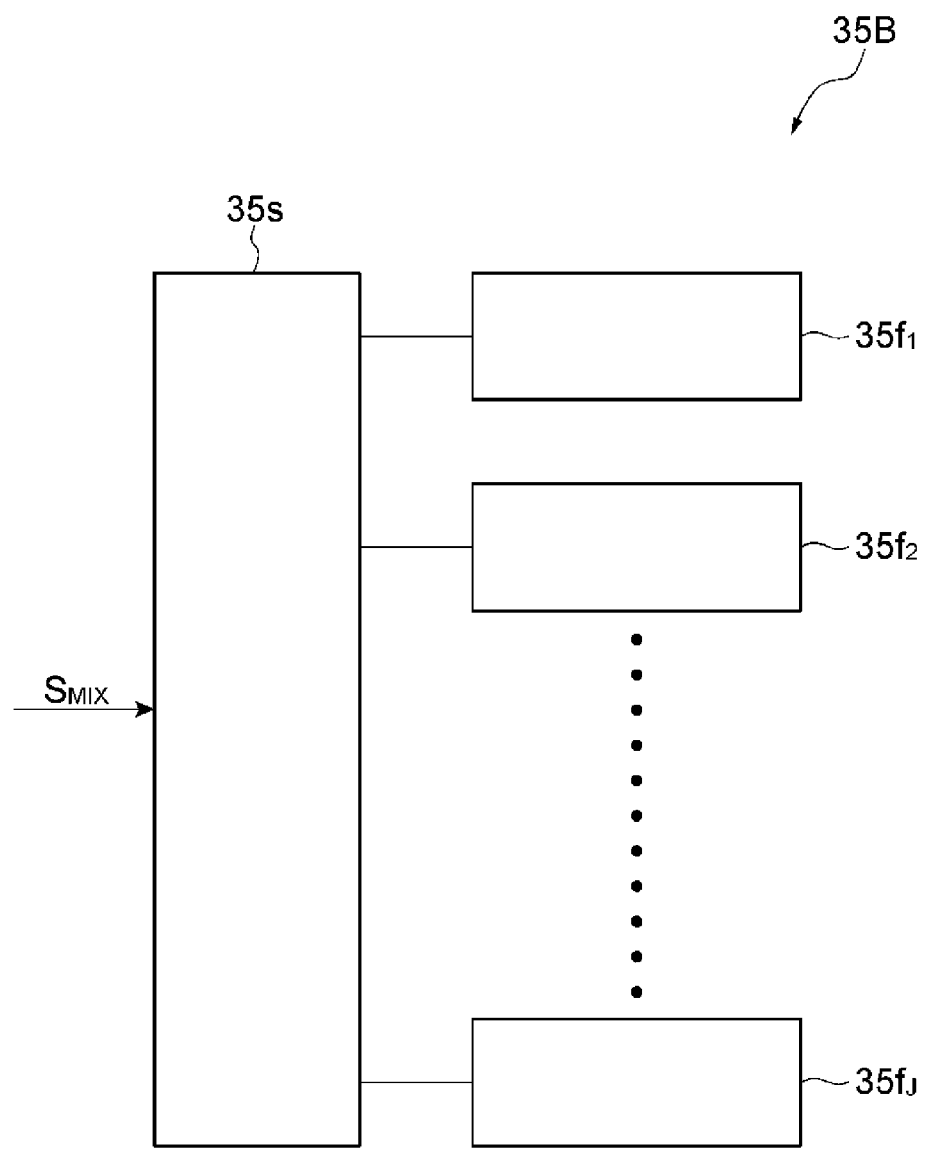
FIG. 7 is a view illustrating a configuration of another example of a filter which may be adopted in a plasma processing apparatus according to an embodiment.

Hereinafter, FIG. 7 will be referred to. FIG. 7 is a view illustrating a configuration of another example of the filter which may be adopted in the plasma processing apparatus according to the embodiment. In the plasma processing apparatus 1, a filter 35B illustrated in FIG. 7 may be used, instead of the filter 35. The filter 35B includes a plurality of (a J number of) filters $35f_1$ to $35f_J$ having different passbands. The center frequencies of the plurality of filters $35f_1$ to $35f_J$ are a plurality of source frequencies which may be each set in the radio-frequency power supply 31. The passband of each of the plurality of filters $35f_1$ to $35f_J$ is a band between the center frequency −Wf/2 and the center frequency+Wf/2. Wf is the width of the passband of the filter 35. Wf/2 is smaller than $f_B$.

The filter 35B further includes a selector 35s. The selector 35s selects a filter having the source frequency $f_{RFn}$ in the phase period $SP_n$ as its center frequency among the plurality of filters $35f_1$ to $35f_J$, and inputs the one or more mixed signals $S_{MIX}$ to the selected filter. Accordingly, the one or more signals $S_{FIn}$ are output from the selected filter, in the phase period $SP_n$.

While various embodiments have been described, various additions, omissions, substitutions, and changes may be made without being limited to the above-described embodiments. Further, elements in the different embodiments may be combined with each other to form another embodiment.

In another embodiment, the plasma processing apparatus may be an inductively coupled plasma processing apparatus, an ECR plasma processing apparatus, a helicon wave excited plasma processing apparatus, or a surface wave plasma processing apparatus. In any plasma processing apparatus, the radio-frequency power RF is used for generating plasma.

The plasma processing apparatus 1 also includes one set of the filter 33, the mixer 34, and the filter 35 (or the filter 35B). In another embodiment, the plasma processing apparatus may include a plurality of sets of the filters 33, the mixers 34, and the filters 35. The number of sets is the same as the number of electrical signals acquired by the sensor.

According to an embodiment, in a plasma processing apparatus using a radio-frequency power supply that generates a radio-frequency power having a variable frequency for generating plasma, an unnecessary component may be removed from a signal reflecting a matching state of a load impedance of the radio-frequency power supply.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
   a chamber;
   a substrate support provided in the chamber;
   a bias power supply configured to supply an electrical bias energy to an electrode of the substrate support, in order to draw ions from a plasma generated in the chamber into the substrate placed on the substrate support, wherein the electrical bias energy has a bias frequency, and a cycle of the electrical bias energy has a time length which is a reciprocal of the bias frequency;
   a matching box including a matching circuit;
   a radio-frequency power supply configured to supply a radio-frequency power having a variable frequency into the chamber through the matching box in order to generate the plasma from a gas in the chamber, and adjust the variable frequency of the radio-frequency power in each of a plurality of phase periods within the cycle of the electrical bias energy;
   a sensor configured to detect an electrical signal reflecting a deviation of a load impedance of the radio-frequency power supply from a matching state; and
   a filter configured to generate a filtered signal by removing an intermodulation distortion component of the radio-frequency power and the electrical bias energy from the electrical signal in each of the plurality of phase periods.

2. The plasma processing apparatus according to claim 1, wherein the radio-frequency power supply is configured to adjust the variable frequency of the radio-frequency power based on the filtered signal to make the load impedance of the radio-frequency power supply close to a matching state, in each of the plurality of phase periods.

3. The plasma processing apparatus according to claim 1, wherein the electrical signal includes signals representing a voltage and a current which are measured on a transmission path of the radio-frequency power.

4. The plasma processing apparatus according to claim 1, wherein the electrical signal includes a signal representing a power of a reflected wave from a load of the radio-frequency power.

5. The plasma processing apparatus according to claim 1, wherein the radio-frequency power supply includes:
   an oscillator configured to generate a radio-frequency signal; and
   an amplifier configured to amplify the radio-frequency signal, thereby generating the radio-frequency power,
   wherein the plasma processing apparatus further comprises:
   a mixer configured to mix the radio-frequency signal and the electrical signal with each other to generate a mixed signal, and
   wherein the filter is configured to generate the filtered signal from the mixed signal, and has a passband of which center frequency is 0 and width is smaller than the bias frequency.

6. The plasma processing apparatus according to claim 1, wherein the filter includes a plurality of filters having different passbands, and among the plurality of filters, a filter with a passband including the variable frequency of the radio-frequency power in each of the plurality of phase periods is applied to the electrical signal.

7. The plasma processing apparatus according to claim 1, wherein the electrical bias energy is a bias radio-frequency power having the bias frequency.

8. The plasma processing apparatus according to claim 1, wherein the electrical bias energy includes a voltage pulse generated periodically at a time interval having a time length which is a reciprocal of the bias frequency, or a voltage of any waveform that is periodically generated.

9. The plasma processing apparatus according to claim 1, further comprising:
   an upper electrode provided above the substrate support,
   wherein the radio-frequency power supply is electrically connected to the electrode of the substrate support or to the upper electrode through the matching box.

10. The plasma processing apparatus according to claim 1, further comprising:
   a voltage sensor configured to detect a voltage of the electrical bias energy on a transmission path of the electrical bias energy,
   wherein the radio-frequency power supply is configured to specify the cycle of the electrical bias energy and the plurality of phase periods based on the voltage detected by the voltage sensor.

11. A processing method comprising:
   (a) supplying a radio-frequency power from a radio-frequency power supply into a chamber of a plasma processing apparatus through a matching box in order to generate a plasma from a gas in the chamber of the plasma processing apparatus;
   (b) supplying an electrical bias energy to an electrode of a substrate support provided in the chamber, in order to draw ions from the plasma into a substrate placed on the substrate support;
   (c) detecting an electrical signal reflecting a deviation of a load impedance of the radio-frequency power supply from a matching state; and
   (d) generating a filtered signal from the electrical signal by using a filter,
   wherein the electrical bias energy has a bias frequency, and a cycle of the electrical bias energy has a time length which is a reciprocal of the bias frequency,
   a frequency of the radio-frequency power is variable,
   in (a), the frequency of the radio-frequency power in each of a plurality of phase periods within the cycle of the electrical bias energy is adjusted, and
   in (d), the filtered signal is generated by removing an intermodulation distortion component of the radio-frequency power and the electrical bias energy from the electrical signal in each of the plurality of phase periods.

* * * * *